(12) United States Patent
Iijima et al.

(10) Patent No.: US 7,813,133 B2
(45) Date of Patent: Oct. 12, 2010

(54) SEMICONDUCTOR DEVICE

(75) Inventors: Makoto Iijima, Kawasaki (JP); Seiji Ueno, Kawasaki (JP); Osamu Igawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 335 days.

(21) Appl. No.: 11/359,996

(22) Filed: Feb. 23, 2006

(65) Prior Publication Data

US 2007/0139892 A1 Jun. 21, 2007

(30) Foreign Application Priority Data

Dec. 20, 2005 (JP) ............................. 2005-367211

(51) Int. Cl.
*H05K 7/20* (2006.01)

(52) U.S. Cl. ................... 361/710; 361/704; 361/719; 438/122; 438/687; 257/707; 257/712; 257/666; 257/739; 165/80.2; 165/185; 428/210; 428/212; 428/600

(58) Field of Classification Search ................ 361/704, 361/707, 717, 719–720; 257/704–720, E23.193, 257/84; 174/260–264, 16.3, 51; 438/49, 438/122, 197, 778; 117/68; 359/853; 165/185
See application file for complete search history.

(56) References Cited

U.S. PATENT DOCUMENTS

| | | | | |
|---|---|---|---|---|
| 5,396,403 A | * | 3/1995 | Patel ........................... | 361/705 |
| 5,825,087 A | | 10/1998 | Iruvanti et al. | |
| 5,838,064 A | * | 11/1998 | Shimada et al. ............. | 257/718 |
| 5,907,474 A | * | 5/1999 | Dolbear ....................... | 361/705 |
| 5,958,522 A | | 9/1999 | Nakagawa et al. | |
| 6,002,173 A | * | 12/1999 | Casati et al. ................. | 257/739 |
| 6,046,498 A | * | 4/2000 | Yoshikawa .................. | 257/706 |
| 6,113,730 A | * | 9/2000 | Ohya et al. ............... | 156/307.3 |
| 6,204,454 B1 | | 3/2001 | Gotoh et al. | |
| 6,225,569 B1 | | 5/2001 | Hashimoto et al. | |
| 6,255,139 B1 | * | 7/2001 | Edwards et al. ............. | 438/122 |
| 6,281,573 B1 | * | 8/2001 | Atwood et al. ............... | 257/706 |
| 6,292,369 B1 | * | 9/2001 | Daves et al. ................. | 361/719 |
| 6,380,621 B1 | * | 4/2002 | Ando et al. .................. | 257/707 |
| 6,407,922 B1 | * | 6/2002 | Eckblad et al. ............. | 361/704 |
| 6,495,924 B2 | * | 12/2002 | Kodama et al. ............. | 257/785 |

(Continued)

FOREIGN PATENT DOCUMENTS

JP        3039488        3/2000

(Continued)

OTHER PUBLICATIONS

"Taiwanese Office Action" with English Translation, dated Oct. 30, 2008.

*Primary Examiner*—Jayprakash N Gandhi
*Assistant Examiner*—Courtney Smith
(74) *Attorney, Agent, or Firm*—Fujitsu Patent Center

(57) ABSTRACT

A semiconductor device includes a board, a semiconductor element mounted on one of main surfaces of the board, a plurality of passive elements provided in the vicinity of the semiconductor element, and a heat radiation plate mounted above the board and connected to a rear surface of the semiconductor element via a heat conductive material. A surface roughness of a surface of the heat radiation plate which surface comes in contact with the heat conductive material is non-uniform at a whole of the surface.

15 Claims, 3 Drawing Sheets

U.S. PATENT DOCUMENTS

| | | | |
|---|---|---|---|
| 6,504,096 B2 * | 1/2003 | Okubora | 174/521 |
| 6,617,683 B2 * | 9/2003 | Lebonheur et al. | 257/707 |
| 6,665,187 B1 * | 12/2003 | Alcoe et al. | 361/719 |
| 6,891,259 B2 * | 5/2005 | Im et al. | 257/687 |
| 6,933,619 B2 * | 8/2005 | Caletka et al. | 257/796 |
| 6,936,919 B2 * | 8/2005 | Chuang et al. | 257/717 |
| 7,031,162 B2 * | 4/2006 | Arvelo et al. | 361/718 |
| 7,180,745 B2 * | 2/2007 | Mandel et al. | 361/719 |
| 7,186,590 B2 * | 3/2007 | Alcoe et al. | 438/122 |
| 7,310,233 B2 * | 12/2007 | Bell | 361/704 |
| 2002/0195690 A1 * | 12/2002 | Fukui | 257/666 |
| 2003/0113578 A1 * | 6/2003 | Omachi et al. | 428/687 |
| 2005/0078456 A1 * | 4/2005 | Mandel et al. | 361/719 |
| 2006/0160373 A1 * | 7/2006 | Kowalski et al. | 438/778 |

FOREIGN PATENT DOCUMENTS

JP     2003-124438     4/2003

* cited by examiner

SEMICONDUCTOR DEVICE

BACKGROUND OF THE INVENTION

1. Field of the Invention

The present invention generally relates to semiconductor devices, and more specifically, to a semiconductor device having a heat spreader configured to radiate heat from a semiconductor element.

2. Description of the Related Art

In a semiconductor device installed in an electronic machine, heat generated at the semiconductor device by operation of a semiconductor element is transferred from a rear surface of the semiconductor element via a heat conductive layer such as heat conductive resin, or silver paste to a heat spreader so as to be radiated.

However, as today's electronic machines have high function or high operability, it is required that the semiconductor devices applied to the electronic machines also have high functionality or high operability. Electric power consumed by the semiconductor element at the semiconductor device is also increasing and therefore the amount of heat generated by the semiconductor element is increasing.

Because of this, it is difficult to sufficiently transfer the heat generated by the semiconductor element to the heat spreader by the above-mentioned heat conductive resin, silver paste, or the like.

Because of this, it has been suggested that a soldering alloy having heat conductivity higher than the heat conductive resin, the silver paste, or the like be used so that the heat generated by the semiconductor element is transferred to the heat spreader so as to be efficiently radiated.

For example, a semiconductor device having an insulation substrate, a heat sink fixed on the insulation substrate, and a semiconductor element fixed by a soldering material on the heat sink, is disclosed in Japanese Laid-Open Patent Application Publication No. 2003-124438. A semiconductor element placement surface having a substantially same configuration as that of a rear surface of the semiconductor element, the semiconductor element placement surface being where the semiconductor element is placed, and a groove surrounding the periphery of the semiconductor element placement surface are provided on an upper surface of this heat sink. The semiconductor element is fixed by the soldering material provided on the semiconductor element placement surface so as to fill the groove. A re-molten soldering material is held on the placement surface and in the groove.

On the other hand, low voltage operation of the semiconductor devices is progressing. Hence, a signal handled by the semiconductor device may be interfered with by electric power noise or cross talk noise.

Because of this, in the electronic machine, a bypass condenser is provided between an electric power source of the semiconductor device and ground so that the entry of external noise causing an error in operation of the semiconductor device is reduced. Normally, such a bypass condenser is provided on a printed circuit board which is a support board where the semiconductor element is mounted.

The support board may be called an interposer.

On the other hand, a thermistor may be provided on the printed circuit board so that the amount of heat generated by the semiconductor element is monitored.

However, in the semiconductor device having a passive element such as the thermistor or a capacitive element such as the condenser, if the soldering alloy is used as a heat combining body between the semiconductor element and the heat spreader so that the heat generated by the semiconductor element is transferred to the heat spreader, when heat is applied in a mounting process of the semiconductor device to the support board, melting of the soldering alloy may be generated.

Because of this, the molten soldering alloy is caused to flow on the surface of the heat spreader so as to flow in the vicinity of the passive element such as the condenser or the thermistor and come in contact with an electrode of the passive element. As a result of this, a short between the electric power source of the semiconductor device and ground may be caused.

In the example discussed in Japanese Laid-Open Patent Application Publication No. 2003-124438, if the metal plating is applied in the groove, the solder may flow from the groove to the outside due to bad wetting.

SUMMARY OF THE INVENTION

Accordingly, the present invention may provide a novel and useful semiconductor device solving one or more of the problems discussed above.

Another and more specific object of the present invention may be to provide a semiconductor device having a structure where the flow on a surface of the heat spreader of a heat conductive material, such as a solder alloy for transferring heat generated by a semiconductor element to a heat spreader, can be effectively prevented.

The above object of the present invention is achieved by a semiconductor device, including a board, a semiconductor element mounted on one of main surfaces of the board, a plurality of passive elements provided in the vicinity of the semiconductor element and a heat radiation plate mounted above the board and connected to a rear surface of the semiconductor element via a heat conductive material, wherein a surface roughness of a surface of the heat radiation plate which surface comes in contact with the heat conductive material is non-uniform at a whole of the surface.

The surface roughness of a first part of the surface of the heat radiation plate which first part comes in contact with the heat conductive material may be smaller than the surface roughness of a second part of the surface of the heat radiation plate. The heat conductive material may not flow in the second part of the surface of the heat radiation plate. The first part, with which the heat conductive material comes in contact, of the surface of the heat radiation plate which first part faces the rear surface of the semiconductor element mounted on the board may have a size equal to or greater than a size of the rear surface of the semiconductor element, and the second part of the surface of the heat radiation plate may be situated outside of the first part.

A material forming the first part of the surface of the heat radiation plate may be different from a material forming the second part of the surface of the heat radiation plate.

The heat radiation plate may be made of metal, a blasting process may be applied to the first part of the surface of the heat radiation plate where the heat conductive material comes in contact; and the surface roughness of the first part may be smaller than the surface roughness of the second part.

According to an embodiment of the present invention, it is possible to provide the semiconductor device having the structure where the flow on the surface of the heat spreader, of the heat conductive material such as the solder alloy for transferring the heat generated by the semiconductor element to the heat spreader can be effectively prevented.

Other objects, features, and advantages of the present invention will be come more apparent from the following detailed description when read in conjunction with the accompanying drawings.

DETAILED DESCRIPTION OF THE PREFERRED EMBODIMENTS

A description is given below, with reference to the FIG. 1 through FIG. 5 of embodiments of the present invention.

First Embodiment

A first embodiment of a semiconductor device of the present invention is discussed with reference to FIG. 1 through FIG. 4.

Figure 1:
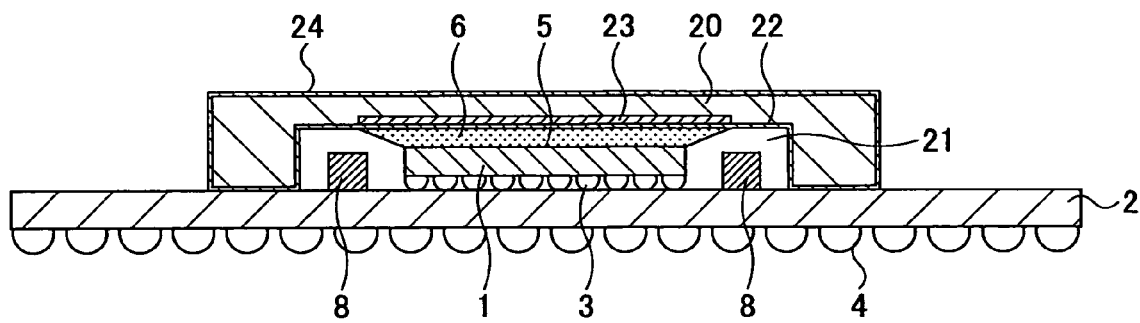
FIG. 1 is a cross-sectional view of a semiconductor device of a first embodiment of the present invention.
Figure 2:
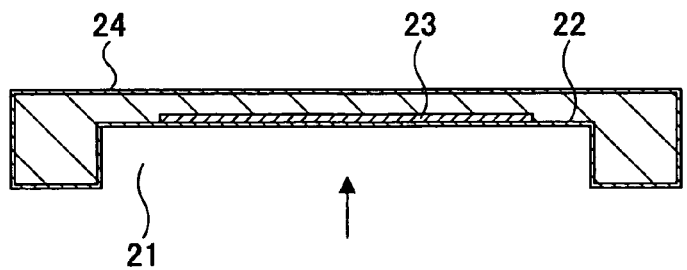
FIG. 2 is a cross-sectional view of a heat spreader provided on the semiconductor device shown in FIG. 1.
Figure 3:
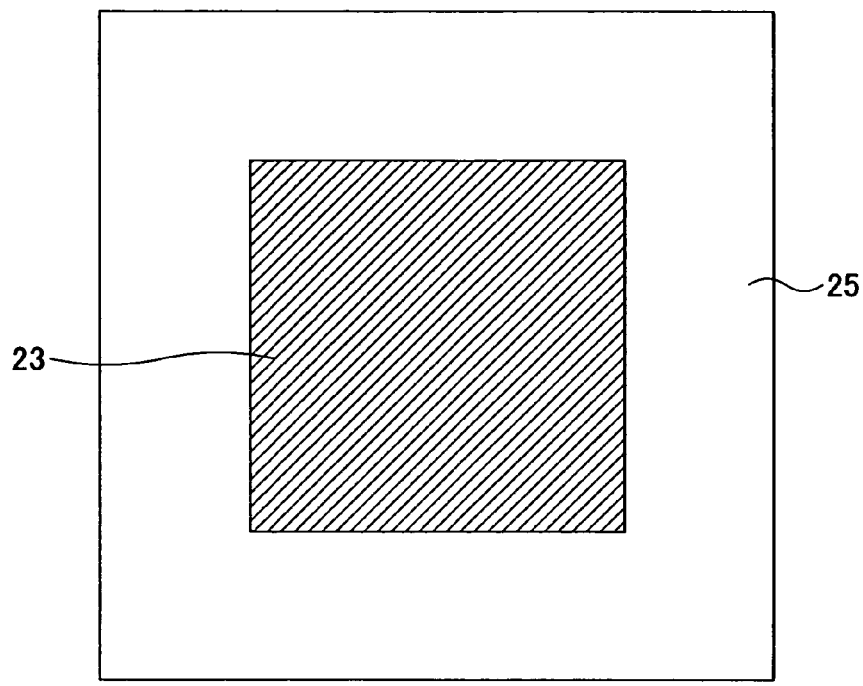
FIG. 3 is a plan view of a space part forming surface of the heat spreader shown in FIG. 2 which view is seen in an arrow direction in FIG. 2.
Figure 4:
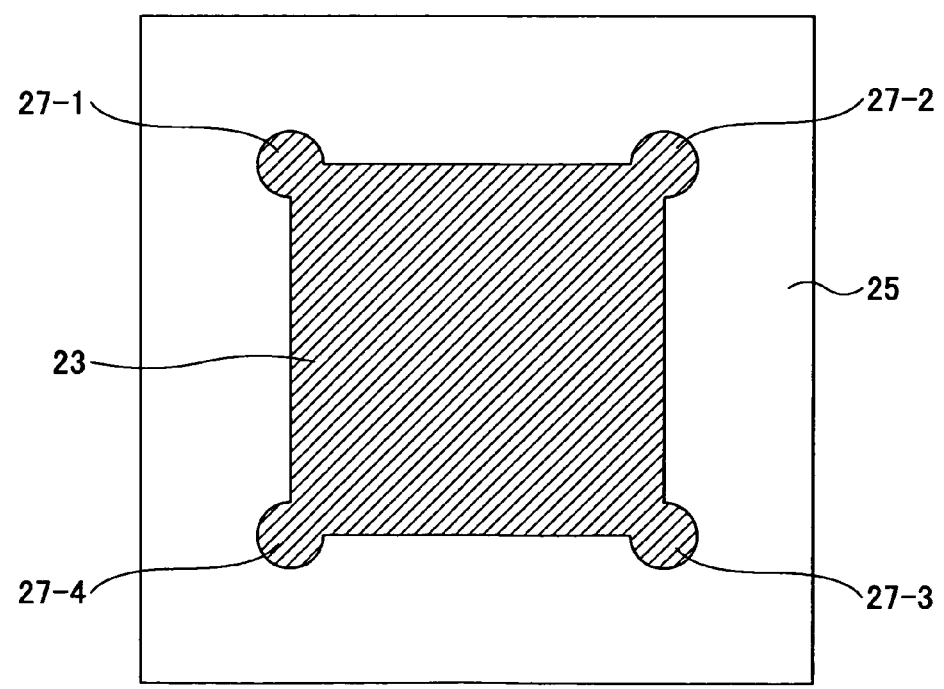
FIG. 4 is a plan view of a space part forming surface of a modified example of the heat spreader shown in FIG. 1 through FIG. 3 which view is seen in an arrow direction in FIG. 2.

Here, FIG. 1 is a cross-sectional view of a semiconductor device of a first embodiment of the present invention. FIG. 2 is a cross-sectional view of a heat spreader provided on the semiconductor device shown in FIG. 1. FIG. 3 is a plan view of a space part forming surface of the heat spreader shown in FIG. 2 which view is seen in an arrow direction in FIG. 2. FIG. 4 is a plan view of a space part forming surface of a modified example of the heat spreader shown in FIG. 1 through FIG. 3 which view is seen in an arrow direction in FIG. 2.

Referring to FIG. 1, a semiconductor device 10 of the first embodiment of the present invention has a structure where a semiconductor element 1 is mounted on a printed circuit board (wiring board) by a flip chip connection.

That is, in the semiconductor device 10 of this embodiment, the semiconductor element 1 is mounted on one of main surfaces, namely an upper surface, of the printed circuit board 2 as a support board, where a surface of the semiconductor element 1, on which surface bumps are formed faces downward. The support board may be called an interposer.

The printed circuit board 2 forms a so-called Ball Grid Array (hereinafter "BGA") type semiconductor device where spherical shaped bumps 4 for connecting to the out-side are provided on another main surface, namely a lower surface, of the printed circuit board 21.

However, the present invention is not limited to this example but may be applied to a Land Grid Array (hereinafter "LGA") type semiconductor device.

An underfill is applied to fill in between the semiconductor element 1 and the printed circuit board 2 so as to be cured (not shown) and thereby the connection between the semiconductor element 1 and the printed circuit board 2 is reinforced.

A soldering alloy 6 as a heat conductive material is provided between a space part forming surface 22 of a heat spreader 20 and a rear surface 5 (upper surface in FIG. 1) of the semiconductor element 1 mounted on the printed circuit board 2 having the above-discussed structure. Therefore, metal plating such as gold (Au) plating is applied on the rear surface 5 of the semiconductor element 1 so that the soldering alloy 6 is wet-spread.

On the other hand, a passive element 8 such as a decoupling condenser or the like is mounted on the printed circuit board 2 and in the periphery of the semiconductor element 1. The passive element 8 is provided on the printed circuit board 2 where an electrode of the passive element 8 is exposed.

Entry of external noise causing an error in operation of the semiconductor device 10 can be reduced by such a decoupling condenser. A resistor, a coil, or the like, in addition to the decoupling condenser, if necessary, is mounted on the printed circuit board 2.

A gap between the space part forming surface 22 of the heat spreader 20 and the rear surface 5 of the semiconductor element 1 is approximately 100 through 200 μm. The semiconductor element 1 and the heat spreader 20 are thermally connected by the soldering alloy 6 provided between the space part forming surface 22 of the heat spreader 20 and the rear surface 5 of the semiconductor element 1.

Heat generated by the semiconductor element 1 is effectively transferred to the heat spreader 20 by the soldering alloy 6.

The soldering alloy 6 has heat conductivity higher than the heat conductive resin, the silver paste, or the like so that the heat generated by the semiconductor element 1 can be efficiently transferred to the heat spreader.

Here, the soldering alloy 6 is wet-spread on a surface having a small surface roughness where the soldering alloy 6 is provided. The soldering alloy 6 is not wet-spread on a surface having a large surface roughness.

A structure of the heat spreader 20 is discussed with reference to FIG. 2 through FIG. 4 in addition to FIG. 1.

As shown in FIG. 1 and FIG. 2, the heat spreader 20 as a heat radiation part includes a concave shaped space part 21 provided at both sides with which the semiconductor element 1 comes in contact. The heat spreader 20 is mounted on the printed circuit board 2 so that the semiconductor element 1 and the passive element 8 are included inside of the space part 21.

A space part forming surface 22 is formed at the upper surface of the space part 21. The space part forming surface 22 is a substantially uniform surface and is not in a concave or convex state due to formation of a groove part or the like.

The heat spreader 20 is formed by sintering a powder such as aluminum silicon carbide (AlSiC) or the like.

Such a heat spreader 20 is formed by sintering with a designated pressure in a designated mold in which a powder such as aluminum silicon carbide (AlSiC) or the like is provided and an aluminum film as one of the powder materials and capable of being easily adapted to the powder material is arranged in the area where thermal connection is made with the semiconductor element 1 via the soldering alloy 5.

Nickel-gold (NiAu) plating 24 is applied on a surface of the heat spreader 20. Instead of the nickel-gold plating 24, nickel plating can be applied.

It is possible to secure the wet spreading of the soldering alloy 6 in a soldering connection part 23.

The space part forming surface 22 of the heat spreader 20 is a uniform surface. The soldering connecting part 23 made of the aluminum film is arranged in the center of the space part forming surface 22.

In the following description, an area of the space part forming surface 22 where the soldering connection part 23 is not formed, namely an external side area of the soldering connection part 23 in the space part forming surface 22, is called a soldering non-connection part 25 (See FIG. 3).

The soldering alloy 6 is provided between the rear surface 5 of the semiconductor element 1 and the soldering connection part 23 at the space part forming surface 22 so that the thermal connection between the semiconductor element 1 and the heat spreader 20 is made.

As discussed above, the soldering connection part 23 is arranged in the center of the space part forming surface 22. More specifically, the soldering connection part 23 is arranged in a part of the space part forming surface 22 corresponding to the rear surface 5 of the semiconductor element 1 provided on the printed circuit board 2. The area where the soldering connection part 23 is arranged slightly extends to the outside of an area facing the rear surface 5 of the semiconductor element 1.

On the other hand, it is necessary to prevent the generation of a short circuit between the electric power of the semiconductor device and ground, due to the wet spreading of the soldering alloy 6 to the passive element 8 provided on the printed circuit board 2, by preventing the soldering alloy 6 from coming in contact with the electrode of the passive element 8. Therefore, the external-most part of the soldering connection part 23 where the soldering alloy 6 is provided should be positioned inside of the position of the passive element 8 on the printed circuit board 2.

Thus, in this embodiment, the heat spreader 20 includes the aluminum layer forming the soldering connection part 23 and is formed by sintering a powder such as aluminum silicon carbide (AlSiC) or the like.

Therefore, the surface of the heat spreader 20 other than the aluminum film forming the soldering connection part 23 is porous and the surface roughness thereof is large. On the other hand, sine the soldering connection part 23 is made of the aluminum film, the surface roughness of the soldering connection part is small.

As discussed above, the nickel-gold plating 24 is formed on the space part forming surface 22 of the heat spreader 20. The surface roughness of the space part forming surface 22 is determined depending on the material of the base of the plating.

In this embodiment, the difference between the surface roughness of the soldering non-connection surface 25 and the surface roughness of the soldering connection part 23 is equal to or greater than 0.5 μm.

The soldering alloy 6 is wet spread in the area whose surface roughness is small and is not wet spread in the area whose surface roughness is large.

Therefore, while the soldering alloy 6 is wet spread in the soldering connection part 23, the soldering alloy 6 is not wet spread in the soldering non-connection surface 25.

The configuration of the soldering connection part 23 is not limited to the substantially rectangular-shaped configuration shown in FIG. 3.

For example, as shown in FIG. 4, extending part 27-1 extending outside in a substantially half-arc shape or half-elliptic shape may be provided in the vicinity of each of the four corners of the soldering connection part 23.

Even if the soldering alloy 6 is wet spread outside of the soldering connection part 23, the soldering alloy 6 flows in the extending parts 27-1 through 27-4. Therefore, it is possible to prevent the generation of a short circuit between the electric power of the semiconductor device and ground, due to the wet spreading of the soldering alloy 6 to the passive element 8 provided on the printed circuit board 2 by the soldering alloy 6 not coming in contact with the electrode of the passive element 8.

Thus, in this embodiment, the material forming the surface of the heat spreader 22 coming in contact with the soldering alloy 6 as the heat conductive material is changed for every area of the surface so that the surface roughness is also changed for every area of the surface, and thereby the flow of the soldering alloy 6 is controlled.

It is necessary for the soldering alloy 6 to sufficiently wet spread at the part of the space part forming surface 22 whose external-most part is positioned inside of the mounting position of the passive element 8 on the printed circuit board 2 such as the position facing the rear surface 5 of the semiconductor element 1 provided on the printed circuit board 2, so that the heat generated by the semiconductor element 1 is transferred to the heat spreader. On the other hand, it is necessary for the soldering alloy 6 to not wet spread at a part of the space part forming surface 22 other than the above-mentioned part.

In this embodiment, the soldering connection part 23 formed by the aluminum film is provided at the part of the space part forming surface 22 whose external-most part is positioned inside of the mounting position of the passive element 8 on the printed circuit board 2 such as the position facing the rear surface 5 of the semiconductor element 1 provided on the printed circuit board 2. The surface roughness of the soldering connection part 23 is smaller than the surface roughness of the area formed by a sintered body and being in the periphery of the solder connection part 23, so that the soldering alloy 6 can be wet spread on the soldering connection part 23 and may not be wet spread on the soldering non-connection part 25 being in the periphery of the soldering connection part 23.

Under this structure, it is possible to prevent the soldering alloy 6 from flowing on the surface of the heat spreader 20 and flowing in the periphery of the passive element 8. Hence, it is possible to prevent the generation of a short circuit between the electric power of the semiconductor device and ground, due to the wet spreading of the soldering alloy 6 to the passive element 8 provided on the printed circuit board 2 by the soldering alloy 6 not coming in contact with the electrode of the passive element 8.

Second Embodiment

Next, a second embodiment of the semiconductor device of the present invention is discussed with reference to FIG. 5.

Figure 5:
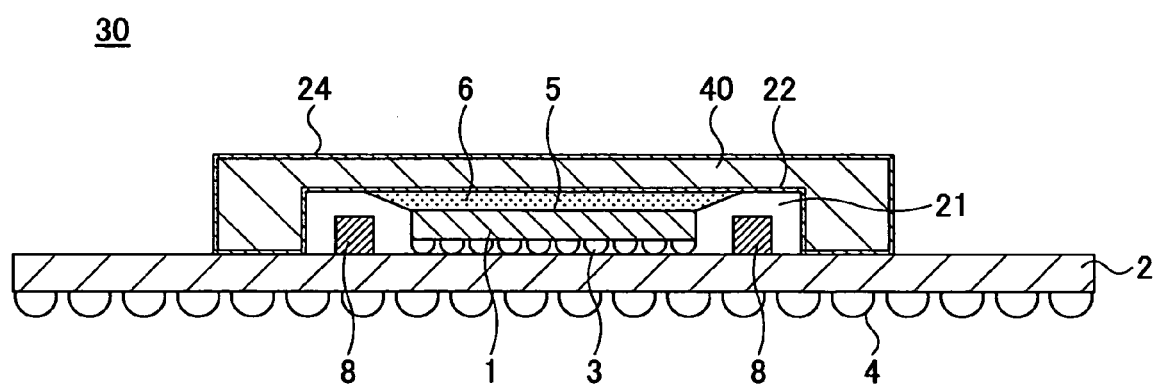
FIG. 5 is a cross-sectional view of a semiconductor device of a second embodiment of the present invention.

Here, FIG. 5 is a cross-sectional view of a semiconductor device of the second embodiment of the present invention. In FIG. 5, parts that are the same as the parts shown in FIG. 1 through FIG. 4 are given the same reference numerals, and explanation thereof is omitted.

A semiconductor device 30 of the second embodiment of the present invention is made of a single metal material. A surface roughness of the metal material is selectively changed so that the flow of the soldering alloy 8 on the surface of the heat spreader is prevented.

In other words, in this embodiment, the heat spreader 40 is made of a metal body formed by copper (Cu), aluminum (Al), copper tungsten (CuW) or aluminum nitride (AlN), or the like.

A blasting process is selectively applied to the space part forming surface 22 of the heat spreader 40 by using a designated mask and therefore the surface roughness of an area where a thermal combination is made between the semiconductor element and the heat spreader via the soldering alloy is made smaller than the surface roughness of other areas.

In this embodiment, the difference between the surface roughness of an area having a large surface roughness and the surface roughness of an area having a small surface roughness is equal to or greater than 0.5 μm.

Nickel-gold plating 24 is applied to the surface of the heat spreader 40 where the selective blasting process is applied.

Instead of the nickel-gold plating 24, nickel plating may be applied. It is possible to prevent oxidation of the surface of the metal heat spreader 40 by such a plating process.

Thus, in this embodiment, the heat spreader 40 may be formed by a single material and the surface roughness of the heat spreader 40 is selectively changed, thereby unnecessary flow of the soldering alloy 6 is prevented.

In other words, in this embodiment, the surface roughness at a portion where a most external part is positioned inside of a position of the printed circuit board 2 where the passive element 8 is provided, such as a portion facing the rear surface 5 of the semiconductor element 1 mounted on the printed circuit board 2, in the space part forming surface 22 of the heat spreader 40 is small, and therefore the soldering alloy 6 can be wet-spread. Since the surface roughness of the other area is large, the soldering alloy 6 may not flow in the other area.

Thus, it is possible to prevent the soldering alloy 6 from flowing on the surface of the heat spreader 40 and flowing out to the periphery of the passive element 8. Therefore, it is possible to prevent the soldering alloy 6 from coming in contact with the electrode or the like of the passive element 8 so that a short between the electric power source of the semiconductor device 30 and ground can be prevented.

The present invention is not limited to these embodiments, but variations and modifications may be made without departing from the scope of the present invention.

This patent application is based on Japanese Priority Patent Application No. 2005-367211 filed on Dec. 20, 2005, the entire contents of which are hereby incorporated by reference.

What is claimed is:

1. A semiconductor device, comprising:
   a board;
   a semiconductor element mounted on one of main surfaces of the board;
   a plurality of passive elements provided in the vicinity of the semiconductor element; and
   a heat radiation plate mounted above the board and connected to a rear surface of the semiconductor element via a heat conductive material;
   wherein a concave shaped space part is formed at a side of the heat radiation plate facing the semiconductor element;
   a space part forming surface is formed at an upper surface of the concave shaped space part and includes a first surface and a second surface, the first surface is arranged in the center of the space part forming surface, and the second surface is an external side area of the first surface in the space part forming surface, and the second surface is external to a boundary of the semiconductor element;
   a surface roughness of the first surface of the space part forming surface of the concave shaped space part is smaller than a surface roughness of the second surface of the space part forming surface of the concave shaped space part, the first surface coming in contact with the heat conductive material, and
   a difference between the surface roughness of the first surface and the surface and the second surface is equal to or greater than 0.5 µm.

2. The semiconductor device as claimed in claim 1, wherein the heat conductive material does not flow in the second surface of the space part forming surface of the heat radiation plate.

3. The semiconductor device as claimed in claim 2, wherein the first surface, with which the heat conductive material comes in contact, of the space part forming surface of the heat radiation plate which first surface faces the rear surface of the semiconductor element mounted on the board has a size equal to or greater than a size of the rear surface of the semiconductor element; and
the second surface of the surface of the heat radiation plate is situated outside of the first surface.

4. The semiconductor device as claimed in claim 3, wherein an external-most part of the first surface is positioned inside of a mounting position of the passive elements provided in the periphery of the semiconductor element on the board.

5. The semiconductor device as claimed in claim 1, wherein the heat conductive material is a soldering alloy.

6. The semiconductor device as claimed in claim 1, wherein a material forming the first surface of the surface of the heat radiation plate is different from a material forming the second surface of the surface of the heat radiation plate.

7. The semiconductor device as claimed in claim 6, wherein the second surface of the space part forming surface of the heat radiation plate is formed by sintering a powder of a material including a material forming the first surface the first surface coming in contact with the heat conductive material.

8. The semiconductor device as claimed in claim 6, wherein the first surface of the space part forming surface of the heat radiation plate is formed by a material including aluminum; and
the second surface of the space part forming surface of the heat radiation plate is formed by sintering a powder of aluminum silicon carbide.

9. The semiconductor device as claimed in claim 1, wherein the heat radiation plate is made of metal;
a blasting process is applied to the first surface of the space part forming surface of the heat radiation plate where the heat conductive material comes in contact.

10. The semiconductor device as claimed in claim 9, wherein the metal forming the heat radiation plate is aluminum or copper.

11. The semiconductor device as claimed in claim 1, wherein metal plating is applied to at least the first surface of the space part forming surface of the heat radiation plate where the heat conductive material comes in contact.

12. The semiconductor device as claimed in claim 11, wherein the metal plating is nickel-gold plating or nickel plating.

13. The semiconductor device as claimed in claim 1, wherein metal plating is applied to the rear surface of the semiconductor element where the heat conductive material is provided.

14. The semiconductor device as claimed in claim 13, wherein the metal plating applied to the rear surface of the semiconductor element where the heat conductive material is provided is gold plating.

15. The semiconductor device as claimed in claim 1, wherein an extending part extending outside from the first surface of the space part forming surface of the heat radiation plate is formed at the first surface of the space part forming surface of the heat radiation plate.

\* \* \* \* \*